United States Patent
Kang et al.

(10) Patent No.: US 11,851,370 B2
(45) Date of Patent: Dec. 26, 2023

(54) LAMINATED BODY FOR PREPARING WAVELENGTH CONVERSION MEMBER AND PREPARATION METHOD OF WAVELENGTH CONVERSION MEMBER

(71) Applicant: DAEJOO ELECTRONIC MATERIALS CO., LTD, Siheung-si (KR)

(72) Inventors: Min Suk Kang, Siheung-si (KR); Jung Kyu Lee, Siheung-si (KR); Seung Jae Lee, Siheung-si (KR); Joong Kyu Lim, Siheung-si (KR)

(73) Assignee: DAEJOO ELECTRONIC MATERIALS CO., LTD, Siheung-si (KR)

( * ) Notice: Subject to any disclaimer, the term of this patent is extended or adjusted under 35 U.S.C. 154(b) by 213 days.

(21) Appl. No.: 16/562,635

(22) Filed: Sep. 6, 2019

(65) Prior Publication Data

US 2020/0079684 A1 Mar. 12, 2020

(30) Foreign Application Priority Data

Sep. 7, 2018 (KR) .................. 10-2018-0107304

(51) Int. Cl.
| | | |
|---|---|---|
| *C03C 4/12* | (2006.01) | |
| *C09K 11/02* | (2006.01) | |
| *C09K 11/77* | (2006.01) | |
| *C03C 3/066* | (2006.01) | |
| *C03C 14/00* | (2006.01) | |
| *B32B 17/06* | (2006.01) | |
| *B32B 37/10* | (2006.01) | |
| *B32B 37/18* | (2006.01) | |
| *C03B 19/06* | (2006.01) | |

(52) U.S. Cl.
CPC .............. *C03C 4/12* (2013.01); *B32B 17/06* (2013.01); *B32B 37/10* (2013.01); *B32B 37/18* (2013.01); *C03B 19/06* (2013.01); *C03C 3/066* (2013.01); *C03C 14/004* (2013.01); *C09K 11/02* (2013.01); *C09K 11/7706* (2013.01); *B32B 2264/102* (2013.01); *B32B 2307/422* (2013.01); *B32B 2315/08* (2013.01); *B32B 2551/00* (2013.01); *C03C 2204/00* (2013.01); *C03C 2214/04* (2013.01)

(58) Field of Classification Search
CPC ......... C03C 4/12; C03C 14/004; C03C 3/066; C09K 11/02; C09K 11/7706; B32B 37/10; B32B 17/06; B32B 37/18
USPC ........................................................ 428/220
See application file for complete search history.

(56) References Cited

U.S. PATENT DOCUMENTS

| | | | |
|---|---|---|---|
| 2014/0177241 A1* | 6/2014 | Ohta ....................... | C03B 19/06 362/382 |
| 2015/0225281 A1* | 8/2015 | Park ..................... | C03C 14/006 313/503 |
| 2017/0040502 A1* | 2/2017 | Fujii ...................... | C04B 35/00 |
| 2018/0305243 A1 | 10/2018 | Kadomi et al. | |
| 2019/0241805 A1 | 8/2019 | Ando | |
| 2019/0316034 A1 | 10/2019 | Kikuchi et al. | |

FOREIGN PATENT DOCUMENTS

| | | | |
|---|---|---|---|
| JP | 2007-182529 A | | 7/2007 |
| JP | 2007191702 A | | 8/2007 |
| JP | 2014088519 A | * | 5/2014 |
| JP | 5994575 B2 | | 9/2016 |
| JP | 6119192 B2 | | 4/2017 |
| JP | 2017-88781 A | | 5/2017 |
| TW | 201826571 A | | 7/2018 |
| TW | 201830733 A | | 8/2018 |
| TW | 201832383 A | | 9/2018 |

OTHER PUBLICATIONS

Machine_English translation_JP_2014088519_A; Furuyama, Tadahito; Method for Producing Wavelength Conversion Member, and Wavelength Conversion Member; May 15, 2014; EPO; whole document (Year: 2014).*
European Patent Office: Communication dated Jan. 29, 2020 in application No. 19195804.0.

* cited by examiner

*Primary Examiner* — Tahseen Khan
(74) *Attorney, Agent, or Firm* — Sughrue Mion, PLLC

(57) ABSTRACT

The present invention relates to a laminate for preparing a wavelength converting member and a process for preparing a wavelength converting member. More particularly, the present invention relates to a laminate for preparing a wavelength converting member, which can be calcined at a temperature of 800° C. or lower, preferably 700° C. or lower and has a high light transmittance, a high refractive index, and a good shape upon the calcination, whereby it can be advantageously used for LEDs, and a process for efficiently preparing the wavelength converting member using a confining layer comprised of specific components.

18 Claims, No Drawings

LAMINATED BODY FOR PREPARING WAVELENGTH CONVERSION MEMBER AND PREPARATION METHOD OF WAVELENGTH CONVERSION MEMBER

TECHNICAL FIELD

The present invention relates to a laminate for preparing a wavelength converting member and a process for preparing a wavelength converting member. More particularly, the present invention relates to a laminate for preparing a wavelength converting member having a high total light transmittance and excellent optical characteristics, and a process for efficiently preparing the wavelength converting member using a confining layer comprised of specific components.

BACKGROUND ART

Light emitting diodes (LEDs) used for conventional lighting and the like are generally composed of blue LEDs and wavelength converting members that absorb blue light emitted from the blue LEDs and achieve white light through the emission of yellow, green, or red light.

The wavelength converting member may be prepared by preparing a green sheet for forming a wavelength converting member that generally comprises glass, followed by laminating a confining layer for controlling the shape of the green sheet on one side or both sides of the green sheet and calcining the laminate. However, if the confining layer is laminated on only one side of the green sheet and calcined, the green sheet may be shrunk unevenly during the calcination, thereby impairing the shape of the wavelength converting member thus prepared.

As a specific example of the process for preparing a conventional wavelength converting member, Korean Patent No. 10-0930165 discloses a process of disposing a first confining layer that comprises an alumina powder on both sides of a green sheet that comprises a glass component and disposing a second confining layer that comprises a combustible material on each of the exposed sides of the first confining layer, thereby preparing a multilayered ceramic substrate. According to the preparation process of the above patent, however, the green sheet melt, i.e., a glass melt, which has a low viscosity at a high temperature during calcination after the lamination, penetrates between the alumina particles used as a component of the first confining layer to form a thin layer on the interface between the two layers. While the confining layers are removed by polishing and/or etching after the calcination, the layer formed between the green sheet and the confining layer is not completely removed but remains on the surface of the wavelength converting member, thereby reflecting light emitted from a light source. Thus, it has a disadvantage that the amount of light to reach a phosphor is reduced.

DETAILED DESCRIPTION OF THE INVENTION

Technical Problem

An object of the present invention is to provide a laminate for preparing a wavelength converting member, which is capable of being calcined at a temperature of 800° C. or lower, preferably 700° C. or lower and having a high light transmittance, a high refractive index, and a good shape upon the calcination, and a process for efficiently preparing the wavelength converting member.

Solution to the Problem

In order to accomplish the above object, the present invention provides a laminate for preparing a wavelength converting member, which comprises a green sheet for forming the wavelength converting member, which comprises a glass matrix and an inorganic phosphor powder dispersed in the glass matrix; a green sheet for a confining layer A, which comprises a silica powder only as an inorganic oxide powder and is disposed on both sides of the green sheet for forming the wavelength converting member; and a green sheet for a confining layer B disposed on both sides of the green sheet for the confining layer A, which are not in contact with the green sheet for forming the wavelength converting member, wherein the glass matrix comprises 0.1 to 15% by mole of $P_2O_5$, 20 to 50% by mole of ZnO, 8 to 40% by mole of $SiO_2$, and 10 to 30% by mole of $B_2O_3$, based on the total number of moles of the glass powder.

In addition, the present invention provides a process for preparing a wavelength converting member, which comprises a first step of preparing a green sheet for forming the wavelength converting member, which comprises a glass powder and an inorganic phosphor powder; a second step of disposing a green sheet for a confining layer A, which comprises a silica powder only as an inorganic oxide powder, on both sides of the green sheet for forming the wavelength converting member; a third step of disposing a green sheet for a confining layer B on both sides of the green sheet for the confining layer A, which are not in contact with the green sheet for forming the wavelength converting member, and laminating them to obtain a laminate; a fourth step of calcining the laminate; and a fifth step of removing the calcined confining layer A and confining layer B from the calcined laminate.

In addition, the present invention provides a wavelength converting member prepared through the above preparation process.

Advantageous Effects of the Invention

The wavelength converting member according to the present member can be prepared by the calcination at a temperature of 800° C. or lower, preferably 700 IC or lower and has a high light transmittance, a high refractive index, and a good shape upon the calcination. Thus, it can be advantageously used for LEDs.

BEST MODE FOR CARRYING OUT THE INVENTION

The laminate for preparing a wavelength converting member of the present invention comprises a green sheet for forming the wavelength converting member, which comprises a glass matrix and an inorganic phosphor powder dispersed in the glass matrix; a green sheet for a confining layer A, which comprises a silica powder only as an inorganic oxide powder and is disposed on both sides of the green sheet for forming the wavelength converting member; and a green sheet for a confining layer B disposed on both sides of the green sheet for the confining layer A, which are not in contact with the green sheet for forming the wavelength converting member, wherein the glass matrix comprises 0.1 to 15% by mole of $P_2O_5$, 20 to 50% by mole of ZnO, 8 to 40% by mole of $SiO_2$, and 10 to 30% by mole of $B_2O_3$, based on the total number of moles of the glass powder.

Glass Matrix

The glass matrix comprises 0.1 to 15% by mole of $P_2O_5$, 20 to 50% by mole of ZnO, 8 to 40% by mole of $SiO_2$, and 10 to 30% by mole of $B_2O_3$, based on the total number of moles of the glass powder. Specifically, the glass matrix comprises 0.1 to 13% by mole, 0.1 to 10% by mole, or 0.2 to 10% by mole of $P_2O_5$; 25 to 50% by mole, 25 to 48% by mole, or 28 to 48% by mole of ZnO; 8 to 38% by mole, 8 to 36% by mole, or 8 to 35% by mole of $SiO_2$; and 11 to 30% by mole, 11 to 28% by mole, or 11 to 27% by mole of $B_2O_3$, based on the total number of moles of the glass powder.

The glass matrix may further comprise 0.1 to 20% by mole of $SnO_2$ and 0.1 to 20% by mole of $Al_2O_3$, based on the total number of moles of the glass powder. Specifically, the glass matrix may further comprise 0.1 to 15% by mole, 0.1 to 10% by mole, 0.1 to 8% by mole, or 0.1 to 6% by mole of $SnO_2$; and 0.1 to 15% by mole, 0.5 to 15% by mole, 1 to 13% by mole, or 1 to 11% by mole of $Al_2O_3$, based on the total number of moles of the glass powder.

The glass matrix may further comprise at least one alkaline earth metal oxide selected from the group consisting of BaO, SrO, and CaO in an amount of 1 to 30% by mole based on the total number of moles of the glass powder. Specifically, the glass matrix may further comprise at least one alkaline earth metal oxide selected from the group consisting of BaO, SrO, and CaO in an amount of 1 to 20% by mole, 1 to 10% by mole, or 1 to 8% by mole, based on the total number of moles of the glass powder.

The glass matrix may further comprise at least one alkaline metal oxide selected from the group consisting of $Na_2O$, $K_2O$, and $Li_2O$ in an amount of 1 to 30% by mole based on the total number of moles of the glass powder. Specifically, the glass matrix may further comprise at least one alkaline metal oxide selected from the group consisting of $Na_2O$, $K_2O$, and $Li_2O$ in an amount of 1 to 20% by mole, 1 to 18% by mole, or 2 to 17% by mole, based on the total number of moles of the glass powder. More specifically, the glass matrix may comprise 1 to 10% by mole or 1.5 to 8% by mole of $Na_2O$; 0 to 10% by mole, 0 to 8% by mole, or 0 to 7% by mole of $K_2O$; and 0 to 10% by mole, 0 to 8% by mole, or 0 to 7% by mole of $Li_2O$, based on the total number of moles of the glass powder.

Specifically, the alkaline metal oxide comprises $Na_2O$ and $K_2O$; $Na_2O$ and $Li_2O$; or $Na_2O$, $K_2O$, and $Li_2O$.

The glass matrix may have a refractive index of 1.4 to 1.7 and may be derived from a glass powder having a softening point (Ts) of 400 to 700° C. and an average particle diameter ($D_{50}$) of 0.1 to 20 μm. Specifically, the glass matrix may have a refractive index of 1.45 to 1.7, 1.5 to 1.66, 1.55 to 1.65, or 1.58 to 1.66, and may be derived from a glass powder having a softening point (Ts) of 400 to 700° C., 500 to 700° C., 550 to 700° C., or 550 to 650° C., and an average particle diameter ($D_{50}$) of 0.1 to 20 μm, 1 to 20 μm, or 1 to 10 μm.

Inorganic Phosphor Powder

The inorganic phosphor powder may comprise at least one phosphor powder selected from the group consisting of yttrium-aluminum-garnet (YAG)-based, ruthenium-aluminum-garnet (LuAG)-based, nitride-based, sulfide-based, and silicate-based materials.

The inorganic phosphor powder may have an average particle diameter ($D_{50}$) of 1 to 50 μm. Specifically, the inorganic phosphor powder may have an average particle diameter ($D_{50}$) of 1 to 50 μm, 5 to 40 μm, or 10 to 30 μm.

Green Sheet for Forming a Wavelength Converting Member

The green sheet for forming a wavelength converting member comprises a glass matrix and an inorganic phosphor powder dispersed in the glass matrix.

The green sheet for forming a wavelength converting member may be prepared from a glass composition that comprises a glass powder, an inorganic phosphor powder, a binder resin, and a solvent. Specifically, the glass composition may comprise 3 to 160 parts by weight of an inorganic phosphor powder and 120 to 280 parts by weight of a glass powder per 100 parts by weight of a binder resin.

The solvent may be contained in an amount suitable for the characteristics and drying conditions of the composition. Specifically, the solvent may be contained in an amount of 30 to 50% by weight based on the total weight of the glass composition.

The solvent may have a low boiling point for the rapid preparation of the green sheet. Specifically, the solvent may have a boiling point of 30 to 150° C. More specifically, the solvent may have a boiling point of 60 to 130° C.

In addition, the solvent may comprise at least one selected from the group consisting of toluene, ethanol, butanol, acetone, and methanol. Specifically, the solvent may comprise at least one selected from the group consisting of toluene, ethanol, and butanol. More specifically, the solvent may comprise toluene, ethanol, and butanol.

The binder resin may comprise at least one selected from the group consisting of polyvinyl butyral (PVB), polyvinyl alcohol (PVA), and poly(vinyl acetate) (PVAc). Specifically, the binder resin may comprise polyvinyl butyral (PVB) or polyvinyl alcohol (PVA).

The binder resin may have a weight average molecular weight of 1,000 to 70,000 g/mole. Specifically, the binder resin may have a weight average molecular weight of 20,000 to 60,000 g/mole.

The glass composition may further comprise a plasticizer. The plasticizer may comprise at least one selected from the group consisting of DOP (dioctyl phthalate), DOA (dioctyl adipate), and TCP (tricresyl phosphate). Specifically, the plasticizer may comprise DOP (dioctyl phthalate) or DOA (dioctyl adipate).

In addition, the plasticizer may be contained in an amount of 10 to 200 parts by weight per 100 parts by weight of the binder resin. Specifically, the plasticizer may be contained in an amount of 30 to 90 parts by weight per 100 parts by weight of the binder resin.

The glass composition may be prepared by mixing a solvent and a binder resin, removing bubbles, and then adding thereto a glass powder, an inorganic phosphor powder, a plasticizer, and the like. Since a solvent having a low boiling point is used in the present invention, the binder resin and the solvent can be mixed at room temperature in the preparation of the glass composition.

The green sheet for forming a wavelength converting member may comprise 30 to 100% by weight of a glass matrix and 5 to 50% by weight of an inorganic phosphor powder based on the total weight of the green sheet. Specifically, the green sheet for forming a wavelength converting member may comprise 40 to 90% by weight of a glass matrix and 8 to 30% by weight of an inorganic phosphor powder based on the total weight of the green sheet.

The green sheet for forming a wavelength converting member may have a thickness of 10 to 2,000 μm. Specifically, the green sheet for forming a wavelength converting member may have a thickness of 20 to 1,200 μm.

Since the inorganic phosphor powder neither melts nor reacts at the calcination temperature, it may be used as a material for a confining layer. However, the inorganic phosphor powder must be concentrated at a high density in order to act as a material for a confining layer, and the compacted inorganic phosphor powder may reduce the refractive index and the light transmittance by preventing light from entering the inside of the wavelength converting member. Thus, it is preferable that the green sheet for a confining layer A and the green sheet for a confining layer B does not contain an inorganic phosphor powder.

Green Sheet for a Confining Layer A

The green sheet for a confining layer A comprises a silica powder only as an inorganic oxide powder. In addition, the green sheet for a confining layer A controls the shape of the green sheet for forming a wavelength converting member during the calcination and serves to help the function of the wavelength converting member.

Unlike alumina, which reacts with a green sheet melt to form a chemical layer that reflects light to reduce the amount of light that reaches a phosphor, a silica powder is excellent in light transmission characteristics, so that it does not cause a decrease in the amount of light. Rather, it remains on the surface of the wavelength converting member upon the calcination and polishing to act as a light diffusing agent, thereby improving the optical characteristics of the wavelength converting member.

The silica powder may have an average particle diameter ($D_{50}$) of 0.1 to 30 μm. Specifically, the silica powder may have an average particle diameter ($D_{50}$) of 0.2 to 20 μm or 0.5 to 10 μm.

The green sheet for a confining layer A may be prepared from a composition for a confining layer A that comprises a silica powder, a binder resin, and a solvent. Specifically, the composition for a confining layer A may comprise 500 to 1,500 parts by weight of a silica powder per 100 parts by weight of the binder resin.

The solvent may be contained in an amount of 30 to 50% by weight based on the total weight of the composition for a confining layer A.

The binder resin and the solvent are the same as described above with respect to the green sheet for forming a wavelength converting member.

The composition for a confining layer A may further comprise a plasticizer. The kind and content of the plasticizer are the same as described above with respect to the green sheet for forming a wavelength converting member.

The composition for a confining layer A may be prepared by mixing a solvent and a binder resin, removing bubbles, and then adding thereto a silica powder, a plasticizer, and the like. Since a solvent having a low boiling point is used in the present invention, the binder resin and the solvent can be mixed at room temperature in the preparation of the composition for a confining layer A.

The green sheet for a confining layer A may have a thickness of 5 to 200 μm. Specifically, the green sheet for a confining layer A may have a thickness of 10 to 200 μm, to 100 μm, 10 to 50 μm, 20 to 100 μm, 20 to 80 μm, or 20 to 50 μm.

The green sheet for a confining layer A must be disposed on both sides of the green sheet for forming a wavelength converting member. If the green sheet for a confining layer A is disposed on only one side of the green sheet for forming a wavelength converting member and calcined, the green sheet may be shrunk unevenly, whereby the shape of the wavelength converting member thus prepared may be bent, or cracks may be generated on the wavelength converting member.

Green Sheet for a Confining Layer B

The green sheet for a confining layer B serves to control the shape of the green sheet for forming a wavelength converting member during the calcination.

The green sheet for a confining layer B must be disposed on both sides of the green sheet for a confining layer A, which are not in contact with the green sheet for forming a wavelength converting member. If the green sheet for a confining layer B is disposed on only one side of the green sheet for a confining layer A and calcined, the green sheet may be shrunk unevenly, whereby the shape of the wavelength converting member thus prepared may be bent, or cracks may be generated on the wavelength converting member.

The green sheet for a confining layer B may comprise at least one inorganic oxide powder selected from the group consisting of alumina, silica, magnesia, and zirconia. Specifically, the green sheet for a confining layer B may comprise alumina or magnesia.

The inorganic oxide powder may have an average particle diameter ($D_{50}$) of 0.1 to 30 μm. Specifically, the inorganic oxide powder may have an average particle diameter ($D_{50}$) of 0.5 to 25 μm, 0.5 to 20 μm, or 1 to 15 μm.

The green sheet for a confining layer B may be prepared from a composition for a confining layer B that comprises an inorganic oxide powder, a binder resin, and a solvent. Specifically, the composition for a confining layer B may comprise 500 to 1,500 parts by weight of an inorganic oxide powder per 100 parts by weight of the binder resin.

The solvent may be contained in an amount of 30 to 50% by weight based on the total weight of the composition for a confining layer B.

The binder resin and the solvent are the same as described above with respect to the green sheet for forming a wavelength converting member.

The composition for a confining layer B may further comprise a plasticizer. The kind and content of the plasticizer are the same as described above with respect to the green sheet for forming a wavelength converting member.

The composition for a confining layer B may be prepared by mixing a solvent and a binder resin, removing bubbles, and then adding an inorganic oxide powder, a plasticizer, and the like. Since a solvent having a low boiling point is used in the present invention, the binder resin and the solvent can be mixed at room temperature in the preparation of the composition for a confining layer B.

The green sheet for a confining layer B may have a thickness of 5 to 200 μm. Specifically, the green sheet for a confining layer B may have a thickness of 10 to 200 μm, 10 to 100 μm, 10 to 50 μm, 20 to 100 μm, 20 to 80 μm, 20 to 50 μm, or 30 to 50 μm.

The total number of laminations of the green sheet for a confining layer A and the green sheet for a confining layer B may be 4 to 50. Specifically, the total number of laminations of the green sheet for a confining layer A and the green sheet for a confining layer B may be 4 to 40, 8 to 30, or 10 to 30.

Process for Preparing a Wavelength Converting Member

The present invention provides a process for preparing a wavelength converting member, which comprises a first step of preparing a green sheet for forming the wavelength converting member, which comprises a glass powder and an inorganic phosphor powder; a second step of disposing a green sheet for a confining layer A, which comprises a silica powder only as an inorganic oxide powder, on both sides of the green sheet for forming the wavelength converting member; a third step of disposing a green sheet for a confining layer B on both sides of the green sheet for the confining layer A, which are not in contact with the green sheet for forming the wavelength converting member, and laminating them to obtain a laminate; a fourth step of calcining the laminate; and a fifth step of removing the calcined confining layer A and confining layer B from the calcined laminate.

First Step

In this step, a green sheet for forming a wavelength converting member, which comprises a glass powder and an inorganic phosphor powder, is prepared.

The glass powder comprises 0.1 to 15% by mole of $P_2O_5$, 20 to 50% by mole of ZnO, 8 to 40% by mole of $SiO_2$, 10 to 30% by mole of $B_2O_3$, 0.1 to 20% by mole of $SnO_2$, and 0.1 to 20% by mole of $Al_2O_3$, based on the total number of moles of the glass powder. Specifically, the glass powder comprises 0.1 to 13% by mole, 0.1 to 10% by mole, or 0.2 to 10% by mole of $P_2O_5$; 25 to 50% by mole, 25 to 48% by mole, or 28 to 48% by mole of ZnO; 8 to 38% by mole, 8 to 36% by mole, or 8 to 35% by mole of $SiO_2$; 11 to 30% by mole, 11 to 28% by mole, or 11 to 27% by mole of $B_2O_3$; 0.1 to 20% by mole, 0.1 to 15% by mole, 0.1 to 10% by mole, 0.1 to 8% by mole, or 0.1 to 6% by mole of $SnO_2$; and 0.1 to 20% by mole, 0.1 to 15% by mole, 0.5 to 15% by mole, 1 to 13% by mole, or 1 to 11% by mole of $Al_2O_3$, based on the total number of moles of the glass powder.

The glass powder may further comprise at least one oxide selected from the group consisting of BaO, SrO, CaO, $Na_2O$, $K_2O$, and $Li_2O$, and the oxide is contained in an amount of 1 to 60% by mole based on the total number of moles of the glass powder. Specifically, the glass powder may further comprise at least one alkaline earth metal oxide selected from the group consisting of BaO, SrO, and CaO in an amount of 1 to 30% by mole based on the total number of moles of the glass powder. More specifically, the glass powder may further comprise at least one alkaline earth metal oxide selected from the group consisting of BaO, SrO, and CaO in an amount of 1 to 20% by mole, 1 to 10% by mole, or 1 to 8% by mole, based on the total number of moles of the glass powder.

Specifically, the glass powder may further comprise at least one alkaline metal oxide selected from the group consisting of $Na_2O$, $K_2O$, and $Li_2O$ in an amount of 1 to 30% by mole based on the total number of moles of the glass powder. More specifically, the glass powder may further comprise at least one alkaline metal oxide selected from the group consisting of $Na_2O$, $K_2O$, and $Li_2O$ in an amount of 1 to 20% by mole, 1 to 18% by mole, or 2 to 17% by mole, based on the total number of moles of the glass powder. Even more specifically, the glass powder may comprise 1 to 10% by mole or 1.5 to 8% by mole of $Na_2O$; 0 to 10%/o by mole, 0 to 8% by mole, or 0 to 7% by mole of $K_2O$; and 0 to 10% by mole, 0 to 8% by mole, or 0 to 7% by mole of $Li_2O$, based on the total number moles of the glass powder.

The glass powder may have a refractive index of 1.4 to 1.7, a softening point (Ts) of 400 to 700° C., and an average particle diameter ($D_{50}$) of 0.1 to 20 μm. Specifically, the glass powder may have a refractive index of 1.45 to 1.7, 1.5 to 1.66, 1.55 to 1.65, or 1.58 to 1.66, a softening point (Ts) of 400 to 700° C., 500 to 700° C., 550 to 700° C., or 550 to 650° C., and an average particle diameter ($D_{50}$) of 0.1 to 20 μm, 1 to 20 μm, or 1 to 10 μm.

The kind and average particle diameter of the inorganic phosphor powder are the same as described above with respect to the laminate for a wavelength converting member.

The green sheet for forming a wavelength converting member may be prepared from a glass composition that comprises a glass powder and an inorganic phosphor powder. The glass composition is the same as described above with respect to the laminate for a wavelength converting member.

The green sheet for forming a wavelength converting member may be prepared by casting the glass composition on a substrate. Specifically, the green sheet for forming a wavelength converting member may be one sheet or may be one obtained by laminating a plurality of green sheets, each of which is prepared by casting, followed by pressing them. In such event, the number of laminations of the green sheet is not particularly limited. For example, it may be laminated so that the thickness of the green sheet for forming a wavelength converting member upon pressing is 50 to 1,500 μm.

The pressing may be carried out at a pressure of 1 to 100 MPa. Specifically, the pressing may be carried out at a pressure of 2 to 50 MPa.

Second Step

In this step, a green sheet for a confining layer A, which comprises a silica powder only as an inorganic oxide powder, is disposed on both sides of the green sheet for forming a wavelength converting member.

The silica powder may have an average particle diameter ($D_{50}$) of 0.1 to 30 μm. Specifically, the silica powder may have an average particle diameter ($D_{50}$) of 0.2 to 20 μm or 0.5 to 10 μm.

The green sheet for a confining layer A may be prepared from a composition for a confining layer A that comprises a silica powder, a binder resin, and a solvent.

The composition for a confining layer A, the binder resin, and the solvent are the same as described above with respect to the laminate for a wavelength converting member.

The green sheet for a confining layer A may have a thickness of 5 to 200 μm. Specifically, the green sheet for a confining layer A may have a thickness of 10 to 200 μm, to 100 μm, 10 to 50 μm, 20 to 100 μm, 20 to 80 μm, or 20 to 50 μm.

Third Step

In this step, a green sheet for a confining layer B is disposed on both sides of the green sheet for a confining layer A, which are not in contact with the green sheet for forming a wavelength converting member, and laminating them to obtain a laminate.

The green sheet for a confining layer B may comprise at least one inorganic oxide powder selected from the group consisting of alumina, silica, magnesia, and zirconia. Specifically, the green sheet for a confining layer B may comprise alumina or magnesia. The inorganic oxide powder may have an average particle diameter (DO) of 0.1 to 30 μm. Specifically, the inorganic oxide powder may have an average particle diameter ($D_{50}$) of 0.5 to 25 μm, 0.5 to 20 μm, or 1 to 15 μm.

The green sheet for a confining layer B may be prepared from a composition for a confining layer B that comprises an inorganic oxide powder, a binder resin, and a solvent.

The composition for a confining layer B, the binder resin, and the solvent are the same as described above with respect to the laminate for preparing a wavelength converting member.

The green sheet for a confining layer B may have a thickness of 5 to 200 μm. Specifically, the green sheet for a confining layer B may have a thickness of 10 to 200 µm, 10 to 100 µm, 10 to 50 µm, 20 to 100 µm, 20 to 80 µm, 20 to 50 µm, or 30 to 50 µm.

The total number of laminations of the green sheet for a confining layer A and the green sheet for a confining layer B may be 4 to 50. Specifically, the total number of laminations of the green sheet for a confining layer A and the green sheet for a confining layer B may be 4 to 30, 8 to 30, or 10 to 30.

The lamination may be carried out for 5 to 90 seconds at a pressure of 12 to 200 MPa and a temperature of 40 to 80° C. Specifically, the lamination may be carried out for 5 to 60 seconds at a pressure of 12 to 180 MPa, 12 to 160 MPa, or 13 to 150 MPa and a temperature of 40 to 70° C. More specifically, the lamination may be carried out using a laminator having an upper part temperature of 60 to 70° C. and a lower part temperature of 40 to 60° C.

Fourth Step

In this step, the laminate is calcined.

The calcination may be carried out at 500 to 800° C. for 10 minutes to 72 hours. Specifically, the calcination may be carried out at 500 to 700° C. for 10 minutes to 52 hours.

Fifth Step

In this step, the calcined confining layer A and confining layer B are removed from the calcined laminate. Specifically, in this step, the calcined confining layer A and confining layer B are removed from the calcined laminate by ultrasonic cleaning. In such event, the ultrasonic cleaning may be carried out for 5 seconds to 2 hours with an ultrasonic wave of 10,000 to 100,000 Hz. Specifically, the ultrasonic cleaning may be carried out for 30 seconds to 1 hour with an ultrasonic wave of 30,000 to 50,000 Hz.

The wavelength converting member may have a thickness of 100 to 1,000 µm. Specifically, the wavelength converting member may have a thickness of 100 to 800 µm, 100 to 500 µm, or 100 to 300 µm.

The wavelength converting member may have a light transmittance of 70 to 80%. Specifically, the wavelength converting member may have a light transmittance of 72 to 80%, 74 to 78%, or 76 to 78%.

As described above, the process for preparing a wavelength converting member can efficiently prepare the wavelength converting member using a confining layer comprised of specific components, which can be prepared by the calcination at a temperature of 800° C. or lower, preferably 700° C. or lower and has a high light transmittance, a high refractive index, and a good shape upon the calcination, whereby it can be advantageously used for LEDs.

EMBODIMENTS FOR CARRYING OUT THE INVENTION

Hereinafter, the present invention will be described in more detail with reference to the following examples. However, these examples are provided to illustrate the present invention, and the scope of the present invention is not limited thereto only.

EXAMPLE

Preparation Example 1: Preparation of a Glass Plate

The respective components were mixed to have a composition shown in Table 1 below and melted at 1,200 to 1,400° C. to prepare a glass material. The glass material thus prepared was pulverized to prepare a glass powder having an average particle diameter of 5.9 µm. The glass powder thus prepared was put into a mold, subjected to compression molding at a pressure of 5 tons for 5 minutes, and then calcined in a furnace at 620° C. for 30 minutes. Thereafter, the mirror surface was abraded to have a surface roughness of 0.2 µm to prepare a glass plate having a thickness of 200 µm.

Preparation Examples 2 to 12

Each glass plate was prepared in the same manner as in Preparation Example 1, except that the contents of the respective components were changed to have the composition of Table 1 below.

Test Example 1

The physical properties of the glass plates of Preparation Examples 1 to 12 were evaluated in the following manner, and the results are shown in Table 1 below.

(1) Glass Transition Temperature (Tg) and Softening Temperature (Ts)

The glass transition temperature and the softening temperature were measured using a thermal analyzer (SDT: Q600, TA Instruments, USA) at a temperature elevation rate of 10° C./minute from room temperature to 1,000° C.

In such event, Tdsp (temperature dilatometer softening point) refers to the temperature of a dilatometer softening point.

(2) Light Transmittance (%)

The transmittance of light having a reference wavelength of 550 nm was measured using a magnetic spectrophotometer (U-350, Japan) of Hitachi. The light transmittance was 100% when a sample was not present.

(3) Refractive Index

The refractive index was measured using Professional Gemstone Refractometers (Kruess model ER601 LED, Germany). For the measurement, the specimen was processed to a thickness of 1 mm (1T), and then a certain amount of a refractive solution was applied to the specimen measurement position so as to be in close contact with the measurement portion.

TABLE 1

| (No. of moles) | | Prep. Ex. 1 | Prep. Ex. 2 | Prep. Ex. 3 | Prep. Ex. 4 | Prep. Ex. 5 | Prep. Ex. 6 | Prep. Ex. 7 | Prep. Ex. 8 | Prep. Ex. 9 | Prep. Ex. 10 | Prep. Ex. 11 | Prep. Ex. 12 |
|---|---|---|---|---|---|---|---|---|---|---|---|---|---|
| Comp. | $P_2O_5$ | 5.2 | 3.2 | 5.8 | 2.2 | 0.3 | 5.3 | 9.5 | 5.0 | 5.2 | 3.7 | — | 0.8 |
| | ZnO | 33.5 | 45.7 | 36.6 | 36.0 | 29.0 | 34.0 | 38.0 | 34.2 | 30.6 | 35.2 | 39.9 | 46.4 |
| | $SiO_2$ | 17.8 | 10.0 | 20.8 | 21.6 | 33.0 | 18.9 | 14.3 | 20.2 | 20.1 | 25.3 | 20.0 | 7.6 |
| | $B_2O_3$ | 18.6 | 26.8 | 12.5 | 21.6 | 21.0 | 18.9 | 19.0 | 15.1 | 12.5 | 15.6 | 19.0 | 26.2 |
| | $Al_2O_3$ | 3.7 | 2.0 | 4.2 | 7.2 | 1.1 | 3.8 | 2.9 | 2.0 | 10.5 | 1.4 | — | 0.3 |
| | $SnO_2$ | 5.2 | 0.1 | 1.7 | 0.7 | 0.2 | 2.3 | 0.5 | 0.1 | 1.7 | 1.4 | — | — |
| | BaO | — | 2.8 | 4.2 | — | 2.4 | 3.8 | 4.8 | 1.1 | 4.2 | 3.7 | 4.8 | 4.2 |

TABLE 1-continued

| (No. of moles) | | Prep. Ex. 1 | Prep. Ex. 2 | Prep. Ex. 3 | Prep. Ex. 4 | Prep. Ex. 5 | Prep. Ex. 6 | Prep. Ex. 7 | Prep. Ex. 8 | Prep. Ex. 9 | Prep. Ex. 10 | Prep. Ex. 11 | Prep. Ex. 12 |
|---|---|---|---|---|---|---|---|---|---|---|---|---|---|
| | SrO | — | — | — | — | — | — | — | 3.0 | — | — | — | — |
| | CaO | 3.7 | 3.0 | — | 7.2 | — | — | 1.9 | 3.0 | — | — | — | — |
| | $Li_2O$ | 2.6 | — | 3.3 | — | 6.6 | 3.0 | 1.4 | 4.0 | 4.0 | 2.0 | 3.8 | 3.3 |
| | $Na_2O$ | 5.7 | 2.8 | 6.3 | 1.8 | 6.4 | 5.8 | 5.3 | 7.7 | 5.3 | 5.5 | 7.2 | 6.4 |
| | $K_2O$ | 4.0 | 3.5 | 4.7 | 1.8 | — | 4.2 | 2.5 | 4.6 | 5.0 | 6.3 | 5.3 | 4.7 |
| | Avg. particle diameter (D50) (μm) | 5.71 | 5.82 | 5.59 | 5.79 | 5.50 | 5.61 | 5.34 | 5.54 | 5.80 | 5.60 | 5.73 | 5.41 |
| TC* (° C.) | Tg | 464 | 512 | 453 | 471 | 456 | 455 | 437 | 450 | 479 | 478 | 463 | 430 |
| | Tdsp | 514 | 524 | 503 | 521 | 495 | 505 | 481 | 499 | 522 | 504 | 516 | 487 |
| | Ts | 596 | 611 | 586 | 612 | 632 | 589 | 579 | 582 | 608 | 599 | 594 | 559 |
| | Light transmittance (%) | 69.3 | 58.2 | 72.2 | 69.2 | 38.8 | 76.9 | 62.1 | 69.8 | 68.9 | 72.1 | 34.6 | 45.3 |
| | Refractive index | 1.65 | 1.59 | 1.59 | 1.59 | 1.59 | 1.61 | 1.59 | 1.59 | 1.6 | 1.6 | 1.59 | 1.64 |

*TC: thermal characteristics

As shown in Table 1, the glass plates of Preparation Examples 1 to 10 showed a high transmittance and excellent refractive index characteristics. They had appropriate softening characteristics with a glass transition temperature of 650° C. or less. In addition, since the light transmittance and the refractive index of a glass matrix affect the optical properties of a wavelength converting member, the characteristics of the wavelength converting members were examined based on these results.

Example 1: Preparation of a Wavelength Converting Member 1-1: Preparation of a Green Sheet for Forming a Wavelength Converting Member 27 g of polyvinyl butyral (PVB, weight average molecular weight: 50,000 g/mole) was added to 81 g of a solvent (a mixture of toluene, ethanol, and butanol at a volume ratio of 3:1:1) and dissolved at room temperature for 1 hour to prepare a binder solution.

11 parts by weight of a YAG-based phosphor powder (average particle diameter ($D_{50}$): 25 μm, manufacturer: Daejoo Electronic Materials, product name: DLP-Y62-25) and 89 parts by weight of the glass powder of Preparation Example 5 were mixed, to which 89 parts by weight of the binder solution and 11 parts by weight of a plasticizer were added to prepare a glass composition. The glass composition was applied to a PET film by a tape casting method and molded into a sheet to obtain a green sheet having a thickness of 50 μm. 2l of the above green sheet were laminated and pressed at a pressure of 14 MPa to obtain a green sheet for forming a wavelength converting member.

1-2: Preparation of a Green Sheet for a Confining Layer A 160 g of the binder solution of Example 1-1, 500 g of a silica powder (average particle diameter ($D_{50}$): 4.9 μm), and 20 g of a plasticizer were mixed to prepare a composition for confining layer A. Thereafter, a sheet for a confining layer A having a thickness of 30 μm was prepared from the composition for a confining layer A by the same tape casting method as in Example 1-1.

1-3: Preparation of a Green Sheet for a Confining Layer B 160 g of the binder solution of Example 1-1, 500 g of an alumina powder (average particle diameter ($D_{50}$): 2.2 μm), and 20 g of a plasticizer were mixed to prepare a composition for confining layer B. Thereafter, a sheet for a confining layer B having a thickness of 30 μm was prepared from the composition for a confining layer B by the same tape casting method as in Example 1-1.

1-4: Preparation of a Wavelength Converting Member

The green sheet for a confining layer A of Example 1-2 was disposed on both sides of the green sheet for forming a wavelength converting member of Example 1-1. Thereafter, the green sheet for a confining layer B of Example 1-3 was disposed on both sides of the green sheet for a confining layer A, which were not in contact with the green sheet for forming a wavelength converting member, to prepare a laminate. The laminate was put into a laminator having an upper part temperature of 65° C. and a lower part temperature of 50° C. and pressed for 30 seconds at a pressure of 14 MPa. Thereafter, the pressed laminate was put into a furnace at 600° C., calcined for 0.5 hour, and then subject to ultrasonic cleaning for 10 minutes using an ultrasonic wave of 45,000 Hz to remove the calcined confining layers A and B, thereby obtaining a wavelength converting member having an average thickness of 100 μm.

Examples 2 to 6 and Comparative Examples 1 to 4

Each wavelength converting member was prepared in the same manner as in Example 1, except that the kind of the glass powder and the kind of the inorganic oxide contained in the green sheet for a confining layer A and the green sheet for a confining layer B were changed as shown in Table 2 below.

Test Example 2

The properties of the wavelength converting members of Examples 1 to 6 and Comparative Examples 1 to 4 were measured in the following manners, and the results are shown in Table 2 below.

(1) State of the Calcined Body

The calcination state of the wavelength converting member was evaluated by the naked eyes.

(2) Light Transmittance (%)

The transmittance of light having a reference wavelength of 550 nm was measured using a magnetic spectrophotometer (U-350, Japan) of Hitachi. The light transmittance was 100% when a sample was not present.

(3) Chromaticity Distribution (Cx, Cy, Luminous Flux (Φv, Lumen (lm)), and Converted Luminous Flux (%))

The chromaticity distribution was measured by placing a wavelength converting member on an excitation light source of 445 nm in an integrating sphere measuring device (LMS-200, J & C Tech.).

TABLE 2

|  | Example | | | | | | Comparative Example | | | |
| --- | --- | --- | --- | --- | --- | --- | --- | --- | --- | --- |
|  | 1 | 2 | 3 | 4 | 5 | 6 | 1 | 2 | 3 | 4 |
| Glass powder | Prep. Ex. 5 | Prep. Ex. 5 | Prep. Ex. 6 | Prep. Ex. 6 | Prep. Ex. 10 | Prep. Ex. 10 | Prep. Ex. 11 | Prep. Ex. 11 | Prep. Ex. 12 | Prep. Ex. 12 |
| Green Sheet for a Confining Layer A | $SiO_2$ | $SiO_2$ | $SiO_2$ | $SiO_2$ | $SiO_2$ | $SiO_2$ | $Al_2O_3$ | $SiO_2$ | $Al_2O_3$ | — |
| Green Sheet for a Confining Layer B | $Al_2O_3$ | MgO | $Al_2O_3$ | MgO | $Al_2O_3$ | MgO | $Al_2O_3$ | — | — | — |
| State of calcined body | Good | Good | Good | Good | Good | Good | Good | Bent | Good | Cracked |
| Light transmittance (%) | 74.2 | 74.2 | 76.9 | 76.9 | 72.1 | 72.1 | 34.6 | 34.6 | 45.3 | 45.3 |
| Cx | 0.292 | 0.307 | 0.292 | 0.301 | 0.297 | 0.302 | 0.355 | — | 0.338 | — |
| Cy | 0.271 | 0.302 | 0.272 | 0.289 | 0.277 | 0.293 | 0.391 | — | 0.367 | — |
| Luminous flux (lm) | 80.0 | 84.1 | 80.1 | 82.5 | 80.7 | 84.1 | 80.2 | — | 81.4 | — |
| Converted luminous flux (%) | 98.9 | 98.1 | 98.9 | 100.2 | 100.0 | 102.2 | 79.6 | — | 79.4 | — |

As shown in Table 2, the wavelength converting members thus prepared had differences in the optical properties due to the differences in transmittance according to the glass compositions. In particular, the wavelength converting members of Examples 4 to 6 showed remarkably excellent optical characteristics.

In contrast, the wavelength converting members of Comparative Examples 1 to 4 had a significantly low transmittance and remarkably low optical characteristics as well.

The invention claimed is:

1. A laminate for preparing a wavelength converting member, which comprises
a first green sheet for forming the wavelength converting member, said first green sheet comprising a glass matrix formed of glass powder and an inorganic phosphor powder dispersed in the glass matrix;
a second green sheet for a confining layer A, which comprises a silica powder only as an inorganic oxide powder and is disposed on both sides of the first green sheet for forming the wavelength converting member; and
a third green sheet for a confining layer B disposed on both sides of the second green sheet for the confining layer A, said both sides of the second green sheet being not in contact with the first green sheet for forming the wavelength converting member,
wherein the glass matrix comprises 0.1 to 15% by mole of $P_2O_5$, 20 to 50% by mole of ZnO, 8 to 40% by mole of $SiO_2$, 10 to 30% by mole of $B_2O_3$, 0.1 to 20% by mole of $SnO_2$, 0.1 to 20% by mole of $Al_2O_3$, and 1 to 30% by mole of $K_2O$, each based on the total number of moles of the glass powder, and
wherein the glass matrix further comprises at least one alkaline earth metal oxide selected from the group consisting of BaO, SrO, and CaO in an amount of 1 to 30% by mole based on the total number of moles of the glass powder;
wherein the third green sheet for the confining layer B comprises at least one inorganic oxide powder selected from the group consisting of alumina, silica, magnesia, and zirconia,
wherein a total number of laminations of the second green sheet for a confining layer A and the third green sheet for a confining layer B is 4 to 50, and
wherein the glass matrix has a refractive index of 1.58 to 1.66 and is derived from the glass powder having a softening point (Ts) of 550 to 650° C. and an average particle diameter ($D_{50}$) of 1 to 10 μm.

2. The laminate for preparing a wavelength converting member of claim 1, wherein the glass matrix further comprises an alkaline metal oxide selected from the group consisting of $Na_2O$, $Li_2O$, and a mixture thereof, in an amount of 1 to 30% by mole based on the total number of moles of the glass powder.

3. The laminate for preparing a wavelength converting member of claim 1, wherein the inorganic phosphor powder comprises at least one phosphor powder selected from the group consisting of yttrium-aluminum-garnet (YAG)-based, ruthenium-aluminum-garnet (LuAG)-based, nitride-based, sulfide-based, and silicate-based materials.

4. The laminate for preparing a wavelength converting member of claim 1, wherein the inorganic phosphor powder has an average particle diameter ($D_{50}$) of 1 to 50 μm.

5. The laminate for preparing a wavelength converting member of claim 1, wherein the silica powder of the second green sheet for the confining layer A has an average particle diameter ($D_{50}$) of 0.1 to 30 μm, and the second green sheet for the confining layer A has a thickness of 5 to 200 μm.

6. The laminate for preparing a wavelength converting member of claim 1, wherein the third green sheet for the confining layer B comprises at least one inorganic oxide powder selected from the group consisting of alumina, silica, magnesia, and zirconia,
the inorganic oxide powder has an average particle diameter ($D_{50}$) of 0.1 to 30 μm, and
the third green sheet for a confining layer B has a thickness of 5 to 200 μm.

7. A process for preparing a wavelength converting member, which comprises a first step of preparing a first green sheet for forming the wavelength converting member, said green sheet comprising a glass matrix, formed from a glass powder, and an inorganic phosphor powder;

a second step of disposing a second green sheet for a confining layer A, which comprises a silica powder only as an inorganic oxide powder, on both sides of the first green sheet for forming the wavelength converting member;

a third step of disposing a third green sheet for a confining layer B on both sides of the second green sheet for the confining layer A, said both sides of the second green sheet being not in contact with the first green sheet for forming the wavelength converting member, and laminating them to obtain a laminate;

a fourth step of calcining the laminate; and a fifth step of removing the calcined confining layer A and confining layer B from the calcined laminate, wherein the glass matrix comprises 0.1 to 15% by mole of $P_2O_5$, 20 to 50% by mole of ZnO, 8 to 40% by mole of $SiO_2$, 10 to 30% by mole of $B_2O_3$, at least one alkaline earth metal oxide selected from the group consisting of BaO, SrO, and CaO in an amount of 1 to 30% by mole, 0.1 to 20% by mole of $SnO_2$, 0.1 to 20% by mole of $Al_2O_3$, and 1 to 30% by mole of $K_2O$, each based on the total number of moles of the glass powder, wherein the third green sheet for the confining layer B comprises at least one inorganic oxide powder selected from the group consisting of alumina, silica, magnesia, and zirconia, wherein a total number of laminations of the second green sheet for a confining layer A and the third green sheet for a confining layer B is 4 to 50, and wherein the glass matrix has a refractive index of 1.58 to 1.66 and is derived from the glass powder having a softening point (Ts) of 550 to 650° C. and an average particle diameter ($D_{50}$) of 1 to 10 μm.

8. The process for preparing a wavelength converting member of claim 7, wherein the glass powder further comprises an alkaline metal oxide selected from the group consisting of $Na_2O$, $Li_2O$ and a mixture thereof in an amount of 1 to 30% by mole based on the total number of moles of the glass powder.

9. The process for preparing a wavelength converting member of claim 7, wherein the inorganic phosphor powder comprises at least one phosphor powder selected from the group consisting of yttrium-aluminum-garnet (YAG)-based, ruthenium-aluminum-garnet (LuAG)-based, nitride-based, sulfide-based, and silicate-based materials.

10. The process for preparing a wavelength converting member of claim 7, wherein the inorganic phosphor powder has an average particle diameter ($D_{50}$) of 1 to 50 μm.

11. The process for preparing a wavelength converting member of claim 7, wherein the silica powder of the green sheet for the confining layer A has an average particle diameter ($D_{50}$) of 0.1 to 30 μm, and the green sheet for the confining layer A has a thickness of 5 to 200 μm.

12. The process for preparing a wavelength converting member of claim 7, wherein the third green sheet for the confining layer B comprises at least one inorganic oxide powder selected from the group consisting of alumina, silica, magnesia, and zirconia, the inorganic oxide powder has an average particle diameter ($D_{50}$) of 0.1 to 30 μm, and the green sheet for a confining layer B has a thickness of 5 to 200 μm.

13. The process for preparing a wavelength converting member of claim 7, wherein the lamination in the third step is carried out for 5 to 90 seconds at a pressure of 12 to 200 MPa and a temperature of 40 to 80° C.

14. The process for preparing a wavelength converting member of claim 7, wherein the calcination in the fourth step is carried out at 500 to 800° C. for 10 minutes to 72 hours.

15. The process for preparing a laminate for a wavelength converting member of claim 7, wherein the fifth step is carried out using ultrasonic cleaning.

16. A wavelength converting member prepared through the preparation process of claim 7.

17. The wavelength converting member of claim 16, which has a thickness of 100 to 1,000 μm.

18. The wavelength converting member of claim 16, which has a light transmittance of 70 to 80%.

* * * * *